(12) United States Patent
Adachi

(10) Patent No.: US 7,489,193 B2
(45) Date of Patent: Feb. 10, 2009

(54) OPERATIONAL AMPLIFIER

(75) Inventor: Kohichiroh Adachi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 140 days.

(21) Appl. No.: 11/723,516

(22) Filed: Mar. 20, 2007

(65) Prior Publication Data

US 2007/0285164 A1 Dec. 13, 2007

(30) Foreign Application Priority Data

Mar. 28, 2006 (JP) ............................. 2006-089414

(51) Int. Cl.
*H03F 3/45* (2006.01)
(52) U.S. Cl. ..................... 330/253; 330/255; 330/263
(58) Field of Classification Search ................. 330/253, 330/255, 263
See application file for complete search history.

(56) References Cited

U.S. PATENT DOCUMENTS

| | | | | |
|---|---|---|---|---|
| 6,531,921 B2 * | 3/2003 | Horie | ........................... | 330/255 |
| 6,657,495 B2 * | 12/2003 | Ivanov et al. | ............... | 330/255 |
| 6,714,076 B1 * | 3/2004 | Kalb | ........................... | 330/255 |
| 7,187,235 B2 * | 3/2007 | Moon | .......................... | 330/255 |
| 7,202,738 B1 * | 4/2007 | Huijsing et al. | ............. | 330/253 |
| 7,262,662 B2 * | 8/2007 | Adachi | ........................ | 330/259 |

FOREIGN PATENT DOCUMENTS

| | | |
|---|---|---|
| JP | 2001-274642 | 10/2001 |
| JP | 2001-339257 | 12/2001 |

* cited by examiner

*Primary Examiner*—Patricia Nguyen
(74) *Attorney, Agent, or Firm*—Dickstein Shapiro LLP

(57) ABSTRACT

A disclosed operational amplifier includes: a pair of differential stages; a cascode amplifier stage; and an output stage. A threshold voltage of an output transistor constituting the output stage is higher than a threshold voltage of other transistors.

18 Claims, 3 Drawing Sheets

OPERATIONAL AMPLIFIER

BACKGROUND OF THE INVENTION

1. Field of the Invention

The present invention relates to an operational amplifier operating on a low voltage.

2. Description of the Related Art

Electronic circuits of operational amplifiers and the like used for electronic devices are desired to always perform stable operations. For example, Patent Document 1 discloses an operational amplifier for controlling an offset voltage fluctuating in accordance with a change of a common-mode input voltage and reducing distortion of output.

In recent years, with the spread of downsized portable electronic device, electronic circuits have also been downsized and configured for low voltage consumption, so that such electronic circuits are desired to perform stable operations on a low power supply voltage.

For example, some operation amplifiers employ transistors with a low threshold. In accordance with this, even when the power supply voltage is lowered, the transistors operate within a saturation region. Thus, it is possible to realize an operational amplifier performing high-gain and stable operations on a low power supply voltage.

Further, Patent Document 2 discloses a CMOS input circuit having a low voltage rail-to-rail CMOS input stage, for example.

Patent Document 1: Japanese Laid-Open Patent Application No. 2001-339257

Patent Document 2: Japanese Laid-Open Patent Application No. 2001-274642

However, when the power supply voltage is further lowered in the above-mentioned conventional operational amplifiers, a circuit configuration thereof has a problem in that some transistors are incapable of performing operation within the saturation region due to different temperatures and processes.

SUMMARY OF THE INVENTION

It is a general object of the present invention to provide an improved and useful operational amplifier in which the above-mentioned problem is eliminated.

A more specific object of the present invention is to provide an operational amplifier that can perform stable and high-gain operations on a low power supply voltage.

According to one aspect of the present invention, there is provided an operational amplifier including: a pair of differential stages; a cascode amplifier stage; and an output stage, wherein a threshold voltage of an output transistor constituting the output stage is higher than a threshold voltage of other transistors.

In accordance with this, even when the power supply voltage is lowered, all transistors constituting the operational amplifier operate in the saturation region, so that it is possible to provide a high-gain operational amplifier.

According to another aspect of the present invention, in the operational amplifier, the threshold voltage of the output transistor is within a range from about 0.7V to about 0.8V, and the threshold voltage of the other transistors is within a range from about 0.3V to about 0.4V.

In accordance with this, even when the power supply voltage is lowered, it is possible to prevent degradation of operation efficiency resulting from different temperatures and processes.

According to another aspect of the present invention, in the operational amplifier, the cascode amplifier stage includes a first cascode connection stage constituted by p-channel MOS transistors and a second cascode connection stage constituted by n-channel MOS transistors, the first cascode connection stage is connected to an output from one of the pair of differential stages, and the second cascode connection stage is connected to an output from the other of the pair of differential stages.

In accordance with this, it is possible to dispose a folded cascode amplifier stage in the operational amplifier.

According to another aspect of the present invention, in the operational amplifier, a gate-source voltage of the output transistor is larger than a sum of saturation drain voltages of two transistors constituting the cascode connection stage connected to a gate of the output transistor.

In accordance with this, the transistors constituting the cascode connection stage always operate in the saturation region, so that it is possible to maintain saturation operations of the cascode connection stage.

According to another aspect of the present invention, in the operational amplifier, a reference voltage is applied to a noninverting input terminal, and an inverting input terminal and an output terminal are directly connected.

According to another aspect of the present invention, in the operational amplifier, the reference voltage is applied to the noninverting input terminal, and the inverting input terminal and the output terminal are connected via a resistance.

According to the present invention, it is possible to provide an operational amplifier capable of performing stable and high-gain operations even when the power supply voltage is lowered.

Other objects, features and advantage of the present invention will become more apparent from the following detailed description when read in conjunction with the accompanying drawings.

DETAILED DESCRIPTION OF THE PREFERRED EMBODIMENTS

An operational amplifier according to the present invention operates all transistors constituting the operational amplifier within a saturation region by setting a threshold voltage of an output transistor constituting an output stage to be higher than a sum of saturation drain voltages of transistors constituting a cascode connection stage connected to the output stage.

Embodiment 1

Figure 1:
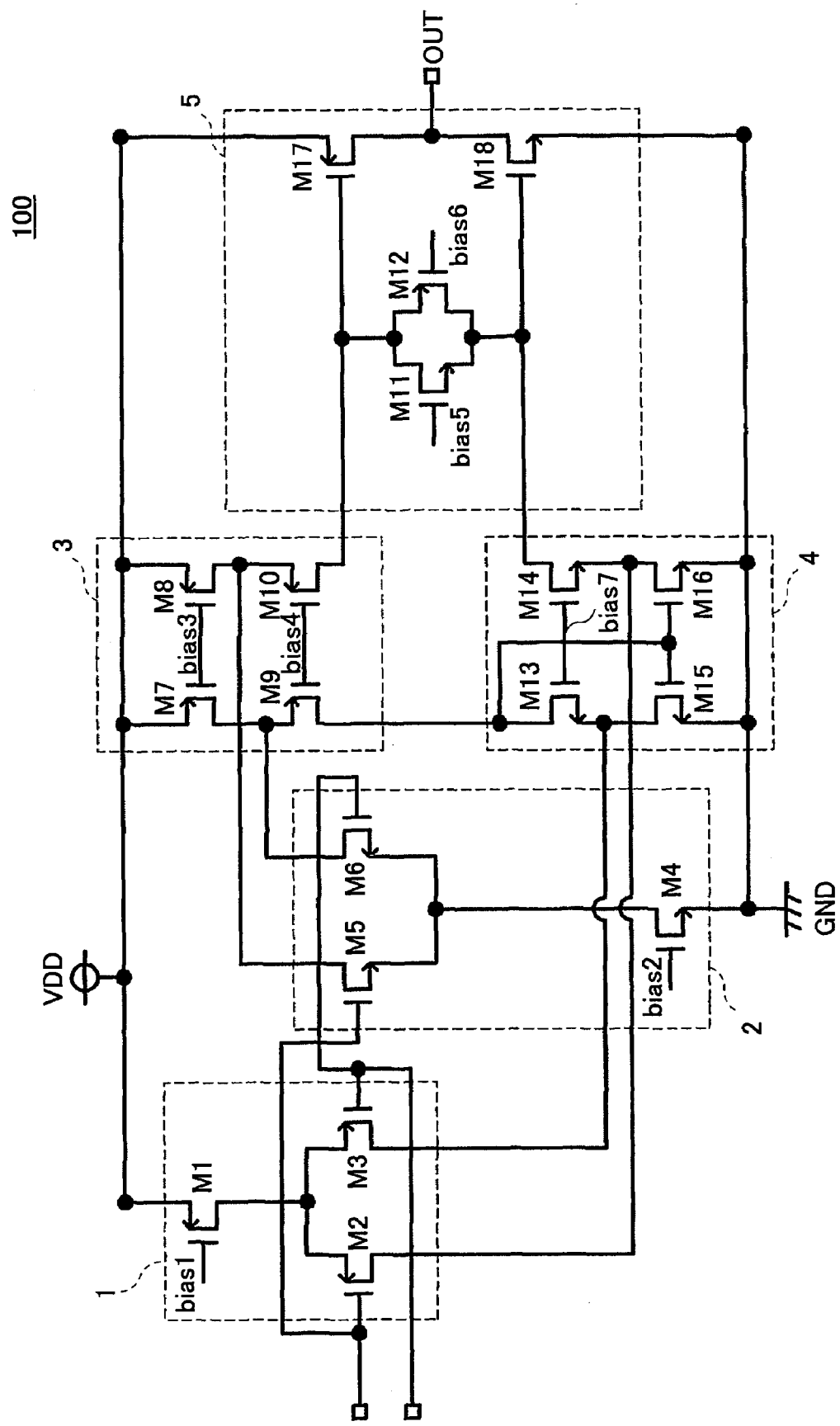
FIG. 1 is a diagram showing a circuit configuration of a class AB operational amplifier 100 according to embodiment 1 of the present invention.

In the following, embodiments of the present invention are described with reference to the drawings. An operational amplifier in the present embodiment is a folded cascode class AB operational amplifier using rail-to-rail input. FIG. 1 is a diagram showing a circuit configuration of a class AB operational amplifier 100 according to embodiment 1 of the present invention.

The class AB operational amplifier 100 according to the present embodiment includes a differential stage 1, a differential stage 2, a cascode connection stage 3, a cascode connection stage 4, and an output stage 5.

In the class AB operational amplifier 100, one of two transistors constituting the differential stage has a noninverting input terminal as a gate terminal and the other transistor has an inverting input terminal as a gate terminal. In the class AB operational amplifier 100, output of the output stage 5 is handled as an output voltage Vout of the class AB operational amplifier 100. The class AB operational amplifier 100 amplifies a difference between input voltages applied to the noninverting input terminal and the inverting input terminal and outputs the amplified difference from an output terminal.

The class AB operational amplifier 100 employs rail-to-rail input in which the differential stages are switched for operation when the threshold voltage of the transistor constituting the differential stage and the input voltage are crossed.

The differential stage 1 includes a transistor M1, a transistor M2, and a transistor M3 as p-channel MOS transistors. The transistor M1 is a MOS transistor for bias current and a bias voltage bias 1 is applied to a gate thereof, so that the transistor M1 is used as a current source. A power supply voltage VDD is applied to a source of the transistor M1 and commonly connected sources of the transistor M2 and the transistor M3 are connected to a drain of the transistor M1. A drain of the transistor M2 is connected to an output of the cascode connection stage 4 and a drain of the transistor M3 is connected to an input of the cascode connection stage 4.

The differential stage 2 includes a transistor M4, a transistor M5, and a transistor M6 as n-channel MOS transistors. The transistor M4 is a MOS transistor for bias current and a bias voltage bias 2 is applied to a gate thereof, so that the transistor M4 is used as a current source. A source of the transistor M4 is grounded and commonly connected sources of the transistor M5 and the transistor M6 are connected to a drain of the transistor M4. A drain of the transistor M5 is connected to an output of the cascode connection stage 3 and a drain of the transistor M6 is connected to an input of the cascode connection stage 3.

The cascode connection stage 3 includes transistors M7, M8, M9, and M10 as p-channel MOS transistors. The transistors M7 and M8 are load current source MOS transistors and a bias voltage bias 3 is applied to gates of the transistors M7 and M8, so that the transistors M7 and M8 are used as a current source. Sources of the transistors M7 and M8 are commonly connected and the power supply voltage VDD is applied to the commonly connected sources. Drains of the transistors M7 and M8 are connected to sources of the transistors M9 and M10.

The transistors M9 and M10 are grounded-gate MOS transistors and a bias voltage bias 4 is applied to gates of the transistors M9 and M10 such that the transistors M7 and M8 operate in a saturation region. In accordance with this configuration, the cascode connection stage 3 constitutes a cascode current source.

The drain of the transistor M6 is connected to a connection point of the transistor M7 and the transistor M9 and an output signal from the differential stage 2 is applied to the connection point. In the same manner, the drain of the transistor M5 is connected to a connection point of the transistor M8 and the transistor M10 and the output signal from the differential stage 2 is applied to the connection point.

A drain of the transistor M9 is connected to a drain of a transistor M13 as an n-channel MOS transistor constituting the cascode connection stage 4. The drain of the transistor M10 is connected to a gate of a transistor M17 as a p-channel MOS transistor constituting the output stage 5.

The cascode connection stage 4 includes the transistor M13, M14, M15, and M16. The transistors M13 and M14 are grounded-gate MOS transistors and a bias voltage bias 7 is applied to gates of the transistors M13 and M14 such that the transistors M15 and M16 operate in a saturation region. The drain of the transistor M13 is connected to the drain of the transistor M9 and a drain of the transistor M14 is connected to a gate of a transistor M18 as an n-channel MOS transistor constituting the output stage 5.

Sources of the transistors M13 and M14 are connected to drains of the transistors M15 and M16. The drain of the transistor M3 is connected to a connection point of the transistor M13 and the transistor M15 and an output signal of the differential stage 1 is applied to the connection point. In the same manner, the drain of the transistor M2 is connected to a connection point of the transistor M14 and the transistor M16 and the output signal of the differential stage 1 is applied to the connection point.

Sources of the transistors M15 and M16 are commonly connected and grounded. Gates of the transistors M15 and M16 are commonly connected and also connected to the drain of the transistor M13 so as to constitute a current mirror circuit.

The cascode connection stage 3 and the cascode connection stage 4 constitute a cascode amplifier stage in which the cascode connection stage 3 is used as a load current source.

The output stage 5 includes transistors M11 and M18 as n-channel MOS transistors and transistors M12 and M17 as p-channel MOS transistors. The transistor M17 and the transistor M18 constitute a push-pull circuit and the power supply voltage VDD is applied to a source of the transistor M17. A drain of the transistor M17 is connected to a drain of the transistor M18 and a source of the transistor M18 is grounded. An output voltage from a connection point of the transistor M17 and the transistor M18 is an output voltage Vout of the class AB operational amplifier 100.

The drain of the transistor M10 is connected to the gate of the transistor M17 and the drain of the transistor M14 is connected to the gate of the transistor M18. An output voltage from the cascode amplifier stage constituted using the cascode connection stage 3 and the cascode connection stage 4 is applied to the gates of the transistor M17 and the transistor M18.

A drain of the transistor M11 and a source of the transistor M12 are commonly connected and also connected to a connection point of the transistor M10 and the transistor M17. A source of the transistor M11 and a drain of the transistor M12 are commonly connected and also connected to a connection point of the transistor M14 and the transistor M18. A bias voltage bias 5 is applied to a gate of the transistor M11 and a bias voltage bias 6 is applied to a gate of the transistor M12.

In the class AB operational amplifier 100, a current of the transistor M17 and the transistor M18 in a steady state is determined from the bias voltage bias 5 and the bias voltage bias 6.

In the class AB operational amplifier 100, when an input voltage is low, the differential stage 1 performs operation. An output signal from the differential stage 1 is used as an input signal to the cascode connection stage 4, the input signal is amplified in the cascode connection stage 3 and the cascode connection stage 4, and the amplified signal is applied to the output stage 5. The output signal is further amplified in the transistor M17 in the output stage 5 and output. When the input voltage is high, differential stages are switched for operation and the differential stage 2 performs operation. An output signal from the differential stage 2 is used as an input signal to the cascode connection stage 4, the input signal is amplified in the cascode connection stage 3 and the cascode connection stage 4, and the amplified signal is applied to the output stage 5. The output signal is further amplified in the transistor M18 in the output stage 5 and output.

In the class AB operational amplifier 100 according to the present embodiment, a threshold voltage of the transistor M17 and the transistor M18 constituting the output stage 5 is higher than a threshold voltage of the transistors constituting the differential stage 1, the differential stage 2, the cascode connection stage 3, and the cascode connection stage 4.

Specifically, in the present embodiment, the threshold voltage of the transistor M17 and the transistor M18 ranges from 0.7V to 0.8V. The threshold voltage of the p-channel MOS transistors of the other transistors is about 0.3V. Although the threshold voltage of the p-channel MOS transistors other than the transistor M17 and the transistor M18 is about 0.3V in the present embodiment, the threshold voltage of all the transistors other than the transistor M17 and the transistor M18 may be about 0.3V. In addition, this voltage value is specifically used in the present embodiment and the threshold voltage is not limited to this. Effects of the present invention are obtained as long as the threshold voltage of the transistors constituting the output stage 5 is higher by a predetermined voltage than the threshold voltage of the transistors constituting elements other than the output stage 5.

In the following, significance of the numerical value is described based on a case where the differential stage 1 performs operation in the class AB operational amplifier 100.

In the steady state of the class AB operational amplifier 100, when the power supply voltage VDD is a low voltage, while a gate-source voltage of the transistors M2 and M3 is constant, a source-drain voltage of the transistor M1 is lower than a saturation drain voltage and the transistor M1 does not operate in a saturation region. In accordance with this, high gain of the class AB operational amplifier 100 is lost.

In view of this, as in the present embodiment, by setting a low threshold voltage for the p-channel MOS transistors constituting the differential stage 1 and the cascode connection stage 3, it is possible to operate the transistor M1 in the saturation region. Thus, the class AB operational amplifier 100 is capable of performing stable and high-gain operations.

Further, in the class AB operational amplifier 100 according to the present embodiment, the gate terminals of the transistor M2 and the transistor M5 are commonly connected and used as a noninverting input terminal of the class AB operational amplifier 100 and the gate terminals of the transistor M3 and the transistor M6 are commonly connected and used as an inverting input terminal. Thus, it is possible to realize voltage-follower connection by applying the output from the output stage 5 to the gate terminals of the transistor M3 and the transistor M6 as the inverting input terminal and applying ground potential to the gate terminals of the transistor M2 and the transistor M5 as the noninverting input terminal.

Further, it is possible to realize inverting input connection by connecting a resistance element between the gate terminals of the transistor M3 and the transistor M6 as the inverting input terminal and the output terminal of the output stage 5. In this case, preferably, the ground potential applied to the gate terminals of the transistor M2 and the transistor M5 as the noninverting input terminal is within a common-mode voltage range as a range allowed for input voltage. In accordance with this, it is possible to realize a high-gain class AB operational amplifier 100.

When the power supply voltage VDD of the class AB operational amplifier 100 is further lowered, even when the transistor M8 operates in the saturation region in the cascode connection stage 3, the transistor M10 does not stably operate in the saturation region due to an influence of different temperatures and processes. In the present embodiment, the threshold of the transistor M17 of the output stage 5 is determined such that the transistor M10 always performs stable operation in the saturation region.

Figure 2:
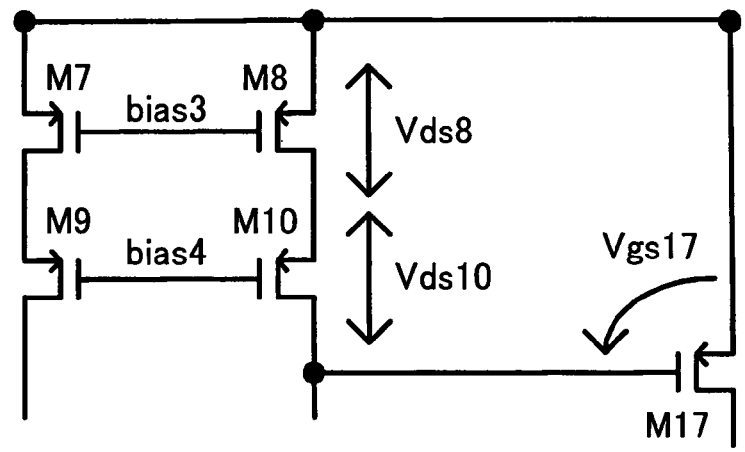
FIG. 2 is a partially enlarged view showing a circuit configuration of a cascode connection stage 3.

FIG. 2 is a partially enlarged view showing a circuit configuration of the cascode connection stage 3. In FIG. 2, a source-drain voltage of the transistor M8 is referenced at Vds 8, a source-drain voltage of the transistor M10 is referenced at Vds 10, and a gate-source voltage of the transistor M17 is referenced at Vgs17.

In this case, when a saturation drain voltage of the transistor M10 is Vdsat10, the transistor M10 operates in the saturation region when Vdsat10<Vds10. In the steady state of the class AB operational amplifier 100, a relationship of the source-drain voltages of the transistor M8 and the transistor M10 is expressed as: Vds8+Vds10=Vgs17.

In this case, for example, when transistors with a low threshold are used for all the transistors constituting the class AB operational amplifier 100, the gate-source voltage Vgs17 of the transistor M17 in the steady state becomes low, so that even when the transistor M8 operates in the saturation region, the transistor M10 does not operate in the saturation region. As a result, gain of the class AB operational amplifier 100 is substantially reduced.

In the present embodiment, such a loss is prevented by setting the threshold voltage of the transistor M17 and the M18 constituting the output stage 5 to be higher than that of other transistors. In other words, the threshold voltage of the transistor M8 and the transistor M10 is set to be low and the threshold voltage of the transistor M17 is set to be high such that the gate-source voltage of the transistor M17 is larger than a sum of the saturation drain voltages of the transistor M8 and the transistor M10.

In this manner, when the threshold voltage of the transistor M17 is set to be high, the gate-source voltage Vgs17 of the transistor M17 is increased. In accordance with this, it is possible to increase the source-drain voltage Vds10 of the transistor M10. And, it is always possible to maintain the source-drain voltage Vds10 of the transistor M10 to be larger than the saturation drain voltage Vdsat10 of the transistor M10. Thus, even when the power supply voltage VDD is lowered, it is possible to stably operate the transistor M8 and the transistor M10 in the saturation region.

Although the above-mentioned description is based on the case where the differential stage 1 performs operation in the present embodiment, the same applies when the differential stage 2 performs operation.

Figure 3:
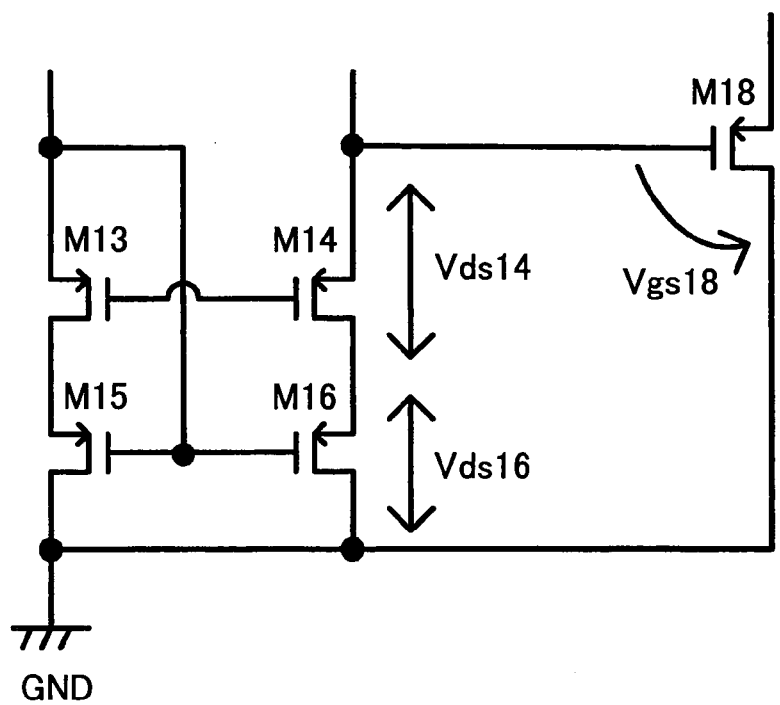
FIG. 3 is a partially enlarged view showing a circuit configuration of a cascode connection stage 4.

FIG. 3 is a partially enlarged view showing a circuit configuration of the cascode connection stage 4. In FIG. 3, a source-drain voltage of the transistor M14 is referenced at Vds14, a source-drain voltage of the transistor M16 is referenced at Vds16, and a gate-source voltage of the transistor M18 is referenced at Vgs18.

In this case, the threshold voltage of the transistor M18 is set to be larger than a sum of the saturation drain voltages of the transistor M14 and the transistor M16. In accordance with this, the gate-source voltage Vgs18 of the transistor M18 is increased, so that even when the transistor M16 operates in the saturation region, it is possible to increase the source-drain voltage Vds14 of the transistor M14. And, it is always possible to maintain the source-drain voltage Vds14 of the transistor M14 to be larger than the saturation drain voltage Vdsat14 of the transistor M14. Thus, it is always possible to stably operate the transistor M14 and the transistor M16 in the saturation region.

As mentioned above, according to the present invention, it is possible to stably operate all the transistors constituting the class AB operational amplifier in the saturation region and provide a class AB operational amplifier capable of performing stable and high-gain operations. Further, according to the present invention, it is possible to provide a class AB operational amplifier capable of performing stable and high-gain operations without being influenced by different temperatures and processes.

Moreover, according to the present invention, it is possible to provide a high-gain class AB operational amplifier capable of supporting a low power supply voltage without increasing a layout area of the circuit.

Although the present embodiment is described based on a folded cascode class AB operational amplifier using rail-to-rail input, the present invention may be applied to p-channel MOS transistor input and n-channel MOS transistor input, for example, in the same manner.

Embodiment 2

Figure 4:
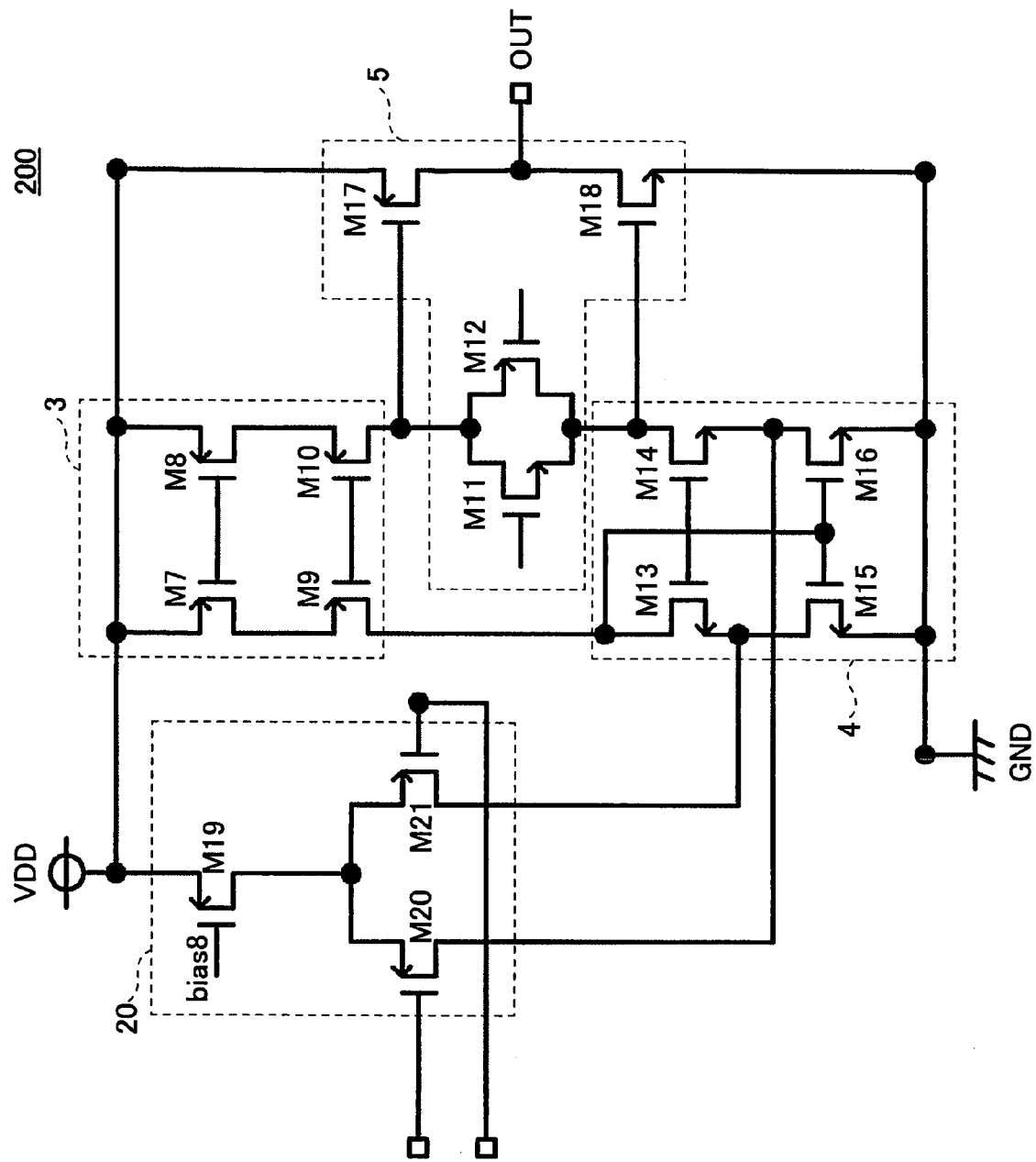
FIG. 4 is a diagram showing a circuit configuration of a class AB operational amplifier 200 according to embodiment 2 of the present invention.

FIG. 4 is a diagram showing a circuit configuration of a class AB operational amplifier 200 according to embodiment 2 of the present invention. The class AB operational amplifier 200 uses the p-channel MOS transistor input.

The configuration of the class AB operational amplifier 200 is the same as that of the class AB operational amplifier 100 except a single differential stage. Accordingly, in the class AB operational amplifier 200 shown in FIG. 2, the same elements or portions as in example 1 are provided with the same reference numerals as in FIG. 1 and description thereof is omitted.

The class AB operational amplifier 200 includes a differential stage 20, the cascode connection stage 3, the cascode connection stage 4, and the output stage 5.

The differential stage 20 includes a transistor M19, a transistor M20, and a transistor M21 as p-channel MOS transistors. The transistor M19 is a MOS transistor for bias current and a bias voltage bias 8 is applied to a gate thereof, so that the transistor M19 is used as a current source. The power supply voltage VDD is applied to a source of the transistor M19. Commonly connected sources of the transistor M20 and the transistor M21 are connected to a drain of the transistor M19.

A drain of the transistor M21 is connected to the connection point of the transistor M13 and the transistor M15 constituting the cascode connection stage 4. A drain of the transistor M20 is connected to the connection point of the transistor M14 and the transistor M16 constituting the cascode connection stage 4. An input voltage is applied to gates of the transistor M20 and the transistor M21.

In the class AB operational amplifier 200, an output signal from the differential stage 20 is used as an input to the cascode connection stage 4, the input is amplified in the cascode connection stage 3 and the cascode connection stage 4, and the amplified input is applied to the output stage 5. An output signal is further amplified in the transistor M17 in the output stage 5 and output.

In the present embodiment, in the same manner as in embodiment 1, the threshold voltage of the transistor M17 is set to be larger than the sum of the saturation drain voltages of the transistor M8 and the transistor M10. And, the threshold voltage of the transistor M18 is set to be larger than the sum of the saturation drain voltages of the transistor M14 and the transistor M16. In accordance with this, it is possible to obtain the same effects as in embodiment 1.

In the present embodiment, although the differential stage 20 is constituted using the p-channel MOS transistors, the differential stage 20 may be constituted using n-channel MOS transistors. In this case, a transistor to be used as an MOS transistor for bias current may be disposed on a ground side and two n-channel MOS transistors may be disposed between the MOS transistor for bias current and the cascode connection stage 3 in which sources of the two n-channel MOS transistors are commonly connected.

The present invention is not limited to the specifically disclosed embodiment, and variations and modifications may be made without departing from the scope of the present invention.

The present application is based on Japanese priority application No. 2006-089414 filed Mar. 28, 2006, the entire contents of which are hereby incorporated herein by reference.

What is claimed is:

1. An operational amplifier comprising:
a pair of differential stages;
a cascode amplifier stage; and
an output stage, wherein
a threshold voltage of an output transistor constituting the output stage is higher than a threshold voltage of other transistors.

2. The operational amplifier according to claim 1, wherein
the threshold voltage of the output transistor is within a range from about 0.7V to about 0.8V, and
the threshold voltage of the other transistors is within a range from about 0.3V to about 0.4V.

3. The operational amplifier according to claim 1, wherein
the cascode amplifier stage includes a first cascode connection stage constituted by p-channel MOS transistors and a second cascode connection stage constituted by n-channel MOS transistors,
the first cascode connection stage is connected to an output from one of the pair of differential stages, and
the second cascode connection stage is connected to an output from the other of the pair of differential stages.

4. The operational amplifier according to claim 2, wherein
the cascode amplifier stage includes a first cascode connection stage constituted by p-channel MOS transistors and a second cascode connection stage constituted by n-channel MOS transistors,
the first cascode connection stage is connected to an output from one of the pair of differential stages, and
the second cascode connection stage is connected to an output from the other of the pair of differential stages.

5. The operational amplifier according to claim 1, wherein
a gate-source voltage of the output transistor is larger than a sum of saturation drain voltages of two transistors constituting the cascode connection stage connected to a gate of the output transistor.

6. The operational amplifier according to claim 2, wherein
a gate-source voltage of the output transistor is larger than a sum of saturation drain voltages of two transistors constituting the cascode connection stage connected to a gate of the output transistor.

7. The operational amplifier according to claim 1, wherein
a reference voltage is applied to a noninverting input terminal, and
an inverting input terminal and an output terminal are directly connected.

8. The operational amplifier according to claim 2, wherein
a reference voltage is applied to a noninverting input terminal, and
an inverting input terminal and an output terminal are directly connected.

9. The operational amplifier according to claim 3, wherein
a reference voltage is applied to a noninverting input terminal, and
an inverting input terminal and an output terminal are directly connected.

10. The operational amplifier according to claim 4, wherein
a reference voltage is applied to a noninverting input terminal, and
an inverting input terminal and an output terminal are directly connected.

11. The operational amplifier according to claim 5, wherein a reference voltage is applied to a noninverting input terminal, and an inverting input terminal and an output terminal are directly connected.

12. The operational amplifier according to claim 6, wherein a reference voltage is applied to a noninverting input terminal, and an inverting input terminal and an output terminal are directly connected.

13. The operational amplifier according to claim 1, wherein a reference voltage is applied to a noninverting input terminal, and an inverting input terminal and an output terminal are connected via a resistance.

14. The operational amplifier according to claim 2, wherein a reference voltage is applied to a noninverting input terminal, and an inverting input terminal and an output terminal are connected via a resistance.

15. The operational amplifier according to claim 3, wherein a reference voltage is applied to a noninverting input terminal, and an inverting input terminal and an output terminal are connected via a resistance.

16. The operational amplifier according to claim 4, wherein a reference voltage is applied to a noninverting input terminal, and an inverting input terminal and an output terminal are connected via a resistance.

17. The operational amplifier according to claim 5, wherein a reference voltage is applied to a noninverting input terminal, and an inverting input terminal and an output terminal are connected via a resistance.

18. The operational amplifier according to claim 6, wherein a reference voltage is applied to a noninverting input terminal, and an inverting input terminal and an output terminal are connected via a resistance.

* * * * *